(12) United States Patent
Ishii et al.

(10) Patent No.: US 7,961,762 B2
(45) Date of Patent: Jun. 14, 2011

(54) WHITE LIGHT-EMITTING LAMP AND ILLUMINATING DEVICE USING THE SAME

(75) Inventors: Tsutomu Ishii, Yokohama (JP);
Yasuhiro Shirakawa, Yokohama (JP);
Ryo Sakai, Yokohama (JP); Yasumasa Ooya, Chigasaki (JP); Hajime Takeuchi, Yokohama (JP)

(73) Assignees: Kabushiki Kaisha Toshiba, Tokyo (JP);
Toshiba Materials Co., Ltd., Yokohama-shi (JP)

( * ) Notice: Subject to any disclaimer, the term of this patent is extended or adjusted under 35 U.S.C. 154(b) by 120 days.

(21) Appl. No.: 12/526,367

(22) PCT Filed: Feb. 7, 2008

(86) PCT No.: PCT/JP2008/000174
§ 371 (c)(1),
(2), (4) Date: Aug. 7, 2009

(87) PCT Pub. No.: WO2008/096545
PCT Pub. Date: Aug. 14, 2008

(65) Prior Publication Data
US 2010/0322275 A1    Dec. 23, 2010

(30) Foreign Application Priority Data
Feb. 9, 2007    (JP) .................................. 2007-030289

(51) Int. Cl.
*H01S 3/30* (2006.01)
*H01S 3/10* (2006.01)
*H01S 3/16* (2006.01)

(52) U.S. Cl. ................ 372/5; 372/22; 372/42

(58) Field of Classification Search ............... 372/5, 22, 372/42, 75
See application file for complete search history.

(56) References Cited

U.S. PATENT DOCUMENTS

| | | |
|---|---|---|
| 7,023,019 B2 | 4/2006 | Maeda et al. |
| 7,271,423 B2 | 9/2007 | Hanamoto et al. |
| 7,422,504 B2 | 9/2008 | Maeda et al. |
| 2004/0245532 A1 | 12/2004 | Maeda et al. |
| 2008/0042156 A1 | 2/2008 | Hanamoto et al. |

FOREIGN PATENT DOCUMENTS

| | | |
|---|---|---|
| EP | 1 447 853 | 8/2004 |
| JP | 2002 171000 | 6/2002 |
| JP | 2003 160785 | 6/2003 |
| JP | 3749243 | 12/2005 |
| JP | 2006 80443 | 3/2006 |
| JP | 2007 9141 | 1/2007 |
| WO | 2006 068141 | 6/2006 |

*Primary Examiner* — Armando Rodriguez
(74) *Attorney, Agent, or Firm* — Oblon, Spivak, McClelland, Maier & Neustadt, L.L.P.

(57) ABSTRACT

A white light-emitting lamp (1) includes a light-emitting portion (9) which is excited by light emitted from a semiconductor light-emitting element (2) to emit white light. The light-emitting portion (9) contains a blue phosphor, a yellow phosphor and a red phosphor. The yellow phosphor is composed of a europium and manganese-activated alkaline earth silicate phosphor having a composition expressed by $(Sr_{1-x-y-z-u}, Ba_x, Mg_y, Eu_z, Mn_u)_2SiO_4$ ($0.1 \leq x \leq 0.35$, $0.025 \leq y \leq 0.105$, $0.025 \leq z \leq 0.25$, $0.0005 \leq u \leq 0.02$).

14 Claims, 3 Drawing Sheets

WHITE LIGHT-EMITTING LAMP AND ILLUMINATING DEVICE USING THE SAME

TECHNICAL FIELD

The present invention relates to a white light-emitting lamp including a semiconductor light-emitting element and to an illuminating device using it.

BACKGROUND ART

A light emitting diode (LED) is a semiconductor element which converts electrical energy into light such as ultraviolet light or visible light to emit the light, and has advantages that it has a long life and high reliability, and when it is used as a light source, the time which exchanges lamps can be saved. An LED lamp having an LED chip sealed with a transparent resin is used extensively for the backlight of a liquid crystal display device used for a display portion of portable communication devices, PC peripheral devices, office automation equipment, home electric appliances and the like, and also for the illuminating device of signal equipment, switches, vehicle-mounted lamps, general lighting and the like.

As to the color tone of the light irradiated from the LED lamp, light having a visible light region ranging from blue to red suitable for usages can be realized by combining an LED chip and phosphors having various emission colors. Especially, a white light-emitting type LED lamp (white LED lamp) is spreading quickly for usage as the backlight of the liquid crystal display device, vehicle-mounted lamps, and the like. Its use is expected to be increased drastically as a replacement for the fluorescent lamp in the future. For example, since mercury is used for the ordinary fluorescent lamp, it is considered that a white LED lamp not using mercury takes the place of the fluorescent lamp in the future.

At present, an LED lamp combining a blue light emitting LED and a yellow phosphor (such as YAG), and an LED lamp combining an ultraviolet LED having a light emission wavelength of 360 to 440 nm and a mixture (BGR phosphor) of blue, green and red phosphors are known as the white LED lamps which are becoming popular or being tried. The former is becoming more popular than the latter because its luminance characteristics are superior to the latter at present. But, the former white LED lamp has light distribution which is biased toward a blue component and a yellow component, and has insufficient light of a red component. Therefore, even if the former white LED lamp has target emission chromaticity as a light-source light, it has a disadvantage that when this light source is used to see a subject, the reflected light is considerably different from the natural color visible in sunlight.

On the other hand, the latter white LED lamp using the ultraviolet LED is inferior in luminance to the former, but the emitted light or the projected light does not have a heavy irregular color, and it is expected to become the mainstream of the white lamp in the future. As to the white LED lamp using the ultraviolet LED, the improvement of the lamp characteristics such as luminance (brightness), color rendering properties and the like is under way based on the characteristics of the phosphors and their combinations (see Patent References 1, 2). For example, to improve the brightness of the white LED lamp, it is considered to use the yellow phosphor having an emission peak wavelength of 540 to 570 nm instead of the green phosphor having an emission peak wavelength of 500 to 530 nm.

The white LED lamp applying a mixed phosphor (BYR phosphor) containing the yellow phosphor instead of the green phosphor is expected to be a light source for the illuminating device because its brightness is improved more than the white LED lamp using the BGR phosphor. But, the conventional white LED lamp applying the BYR phosphor containing the yellow phosphor is not necessarily improved in its properties and, therefore, it is demanded to be improved more in the luminance, color rendering properties and the like. Meanwhile, for the yellow phosphor, there are proposed various phosphors which are used in combination with the blue light emitting LED.

As the yellow phosphor used in combination with the blue light emitting LED, there are known a cerium-activated yttrium aluminate phosphor (YAG), a cerium-activated terbium aluminate phosphor (TAG), and a europium-activated alkaline earth silicate phosphor (BOSS) (see Patent Reference 3). As to the conventional yellow phosphor, its light-emitting property when excited by the blue light (a light emission wavelength: 430 to 500 nm) emitted from the blue light emitting LED is being studied, but its light-emitting property when excited by the light having a light emission wavelength of 360 to 440 nm emitted from the ultraviolet LED is not studied fully. Therefore, its study and improvement of the light-emitting property are being demanded.

Patent Reference 1: JP-A 2002-171000 (KOKAI)
Patent Reference 2: JP-A 2003-160785 (KOKAI)
Patent Reference 3: JP-B2 3749243 (Patent Registration)

DISCLOSURE OF THE INVENTION

According to an aspect of the present invention, there are provided a white light-emitting lamp which has achieved both high luminance and high color rendering properties by improving characteristics of a yellow phosphor to use a BYR phosphor including a blue phosphor, a yellow phosphor and a red phosphor in combination with a semiconductor light-emitting element such as an LED, and an illuminating device using the same.

A white light-emitting lamp according to an aspect of the present invention includes a semiconductor light-emitting element which emits light having a peak wavelength in a range of 370 nm to 470 nm; and a light-emitting portion, which is excited by the light emitted from the semiconductor light-emitting element to emit white light, containing a blue phosphor which absorbs the light to emit light having a peak wavelength in a range of 440 nm to 470 nm, a yellow phosphor which absorbs the light to emit light having a peak wavelength in a range of 535 nm to 570 nm and a red phosphor which absorbs the light to emit light having a peak wavelength in a range of 590 nm to 630 nm, wherein the yellow phosphor is composed of a europium and manganese-activated alkaline earth magnesium silicate phosphor having a composition expressed by a general formula:

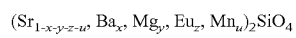

$(Sr_{1-x-y-z-u}, Ba_x, Mg_y, Eu_z, Mn_u)_2SiO_4$ where, x, y, z and u are numerals satisfying $0.1 \leq x \leq 0.35$, $0.025 \leq y \leq 0.105$, $0.025 \leq z \leq 0.25$, $0.0005 \leq u \leq 0.02$.

A illuminating device according to an aspect of the present invention includes the white light-emitting lamp according to the aspect of the present invention.

EXPLANATION OF NUMERALS

1 . . . White LED lamp, 2 . . . LED chip, 3 . . . wiring board, 4 . . . frame body, 5 . . . bonding wire, 6 . . . metal wiring layer, 7 . . . transparent resin layer, 7A . . . first transparent resin layer, 7B . . . second transparent resin layer, 8 . . . BYR phosphor, 9 . . . light-emitting portion, 11 . . . illuminating device.

MODE FOR CARRYING OUT THE INVENTION

Figure 1:
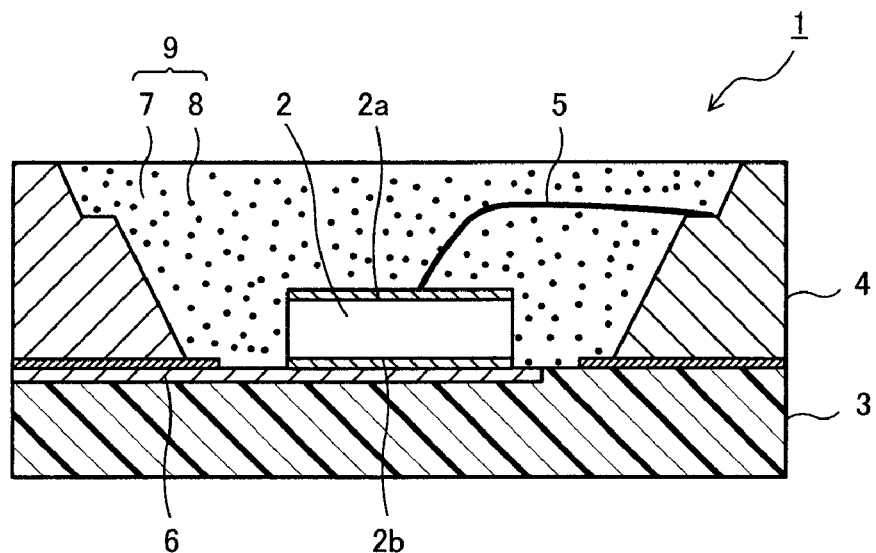
FIG. 1 is sectional view showing a white light-emitting lamp according to an embodiment of the invention.

Modes of conducting the present invention will be described below with reference to the drawings. FIG. 1 is a sectional view showing a structure of an embodiment that the white light-emitting lamp of the invention is applied to a white LED lamp. The white LED lamp 1 shown in FIG. 1 has an LED chip 2 as an excitation source (light source). The excitation source is not limited to the LED chip 2. As the excitation source of the white light-emitting lamp, a semiconductor light-emitting element such as a light-emitting diode, a laser diode or the like having an emission peak wavelength in a range of 370 nm to 470 nm is used.

As the excitation source, various light-emitting diodes of an InGaN type, a GaN type, an AlGaN type and the like are used for the LED chip 2. The LED chip 2 preferably has an emission peak wavelength in a range of 370 nm to 430 nm. The white LED lamp 1 having high luminance and excelling in color reproducibility can be realized by using the LED chip 2 in combination with the BYR phosphor. Here, the light-emitting diode as the excitation source is indicated as the LED chip 2, and the light-emitting lamp for finally obtaining the emitted white light is indicated as the white LED lamp 1.

The LED chip 2 is mounted on a wiring board 3. A cylindrical frame body 4 is formed on the wiring board 3, and the inner wall surface of the frame body 4 serves as a reflection layer. The frame body 4 has at least its surface formed of a conductive material such as metal to configure some parts of the electrical wiring with respect to the LED chip 2. A top electrode 2a of the LED chip 2 is electrically connected to the frame body 4 through a bonding wire 5. A bottom electrode 2b of the LED chip 2 is electrically and mechanically connected to a metal wiring layer 6 of the wiring board 3. A transparent resin 7 is filled in the frame body 4, and the LED chip 2 is buried in the transparent resin layer 7.

The transparent resin layer 7 in which the LED chip 2 is buried contains a phosphor 8 for obtaining white light. The phosphor 8 dispersed in the transparent resin layer 7 is excited by the light from the LED chip 2 to emit white light. In other words, the transparent resin layer 7 in which the phosphor 8 is dispersed functions as a light-emitting portion 9 for emitting white light. The light-emitting portion 9 is formed to cover the light-emitting surface of the LED chip 2. For the transparent resin layer 7, for example, a silicone resin, an epoxy resin or the like is used. The structures of the board 3 and the frame body 4 are arbitrary.

Figure 2:
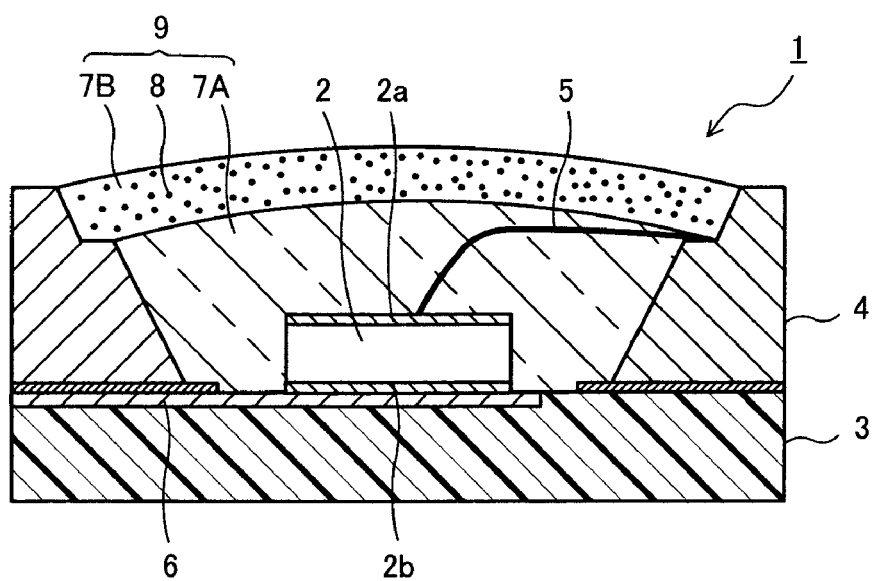
FIG. 2 is a sectional view showing a modified example of the white light-emitting lamp shown in FIG. 1.

As shown in FIG. 2, the light-emitting portion 9 may be provided with a first transparent resin layer 7A not containing the phosphor 8 and a second transparent resin layer 7B containing the phosphor 8. The first transparent resin layer 7A is formed to cover the light-emitting surface of the LED chip 2. The second transparent resin layer 7B is formed to cover the first transparent resin layer 7A. The light-emitting portion 9 configured as described above contributes to improvement of the luminous efficiency of the white LED lamp 1. For example, the first transparent resin 7A is arranged in a range of 500 to 2000 μm from the light-emitting surface of the LED chip 2.

The phosphor 8 for obtaining white light contains a blue (B) phosphor emitting light having a peak wavelength in a range of 440 nm to 470 nm, a yellow (Y) phosphor emitting light having a peak wavelength in a range of 535 nm to 570 nm, and a red (R) phosphor emitting light having a peak wavelength in a range of 590 nm to 630 nm by absorbing the light (for example, ultraviolet light or violet light) emitted from the LED chip 2. The phosphor 8 is a mixed phosphor (BYR phosphor) of blue, yellow and red. The BYR phosphor 8 may contain two types or more of the same color phosphors or may supplementarily contain a phosphor having an emission color other than blue, yellow and red. The BYR phosphor 8 may be dispersed into the transparent resin layer 7 in a state that the individual phosphors are previously integrated by a binding agent.

Electrical energy applied to the white LED lamp 1 is converted into ultraviolet light or violet light by the LED chip 2. The light emitted from the LED chip 2 is converted into light having a longer-wavelength by the BYR phosphor 8 which is dispersed into the transparent resin layer 7. The lights emitted from the blue phosphor, the yellow phosphor and the red phosphor included in the BYR phosphor 8 are mixed in color and discharged. In total, white light is emitted from the white LED lamp 1. When the peak wavelength of each phosphor configuring the BYR phosphor 8 is within the above-described range, the white light excelling in luminance, color rendering properties and the like can be obtained.

For the yellow phosphor among the phosphors configuring the BYR phosphor 8, there is used a europium (Eu) and manganese (Mn)-activated alkaline earth magnesium silicate phosphor having a composition represented by a general formula:

$$(Sr_{1-x-y-z-u}, Ba_x, Mg_y, Eu_z, Mn_u)_2SiO_4 \quad (1)$$

(where, x, y, z and u are numerals satisfying $0.1 \leq x \leq 0.35$, $0.025 \leq y \leq 0.105$, $0.025 \leq z \leq 0.25$, $0.0005 \leq u \leq 0.02$). The Eu and Mn-activated alkaline earth magnesium silicate phosphor of which composition is represented by the formula (1) is excellent in absorption efficiency of ultraviolet light or violet light having a peak wavelength in a range of 370 to 430 nm and also has a red light emitting component reinforcing effect.

Figure 3:
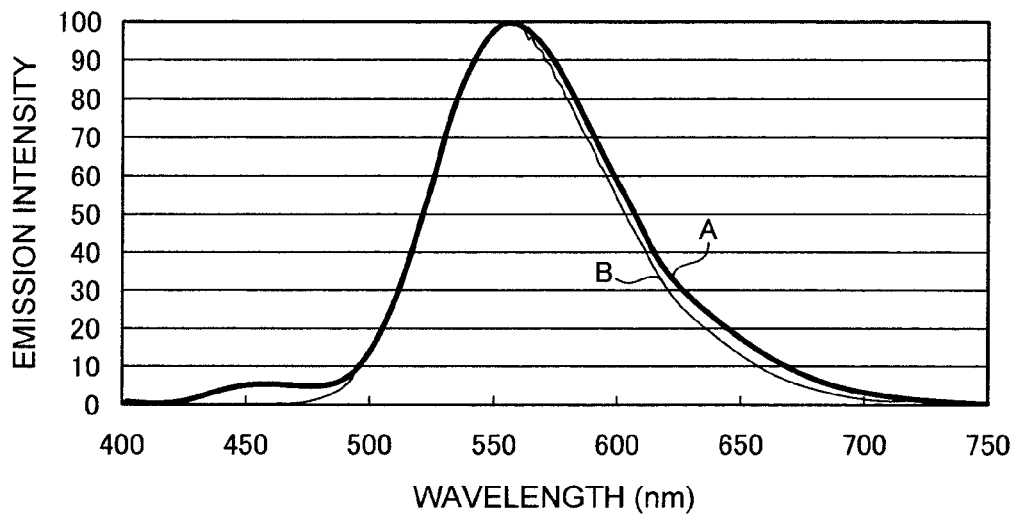
FIG. 3 is a diagram showing an example of emission spectrum of the yellow phosphor applied to the present invention in comparison with a conventional yellow phosphor.

FIG. 3 shows emission spectrum (A) of an Eu and Mn-activated alkaline earth magnesium silicate phosphor $((Sr_{0.7}, Ba_{0.15}, Mg_{0.0975}, Eu_{0.05}, Mn_{0.0025})_2SiO_4)$ in comparison with emission spectrum (B) of a conventional yellow phosphor $((Sr, Ba, Eu)_2SiO_4$ phosphor). It is apparent from FIG. 3 that the Eu and Mn-activated alkaline earth magnesium silicate phosphor has an emission intensity of 600 to 700 nm increased and its reddish color enhanced in comparison with the conventional yellow phosphor. Thus, it becomes possible to reinforce the red light emitting component. In addition, a sub-peak seen around 450 nm can be used as a blue light emitting component.

It is known that the red phosphor is inferior in luminous efficiency with respect to ultraviolet light or violet light having a wavelength in a range of 370 to 430 nm in comparison with the blue phosphor or the yellow phosphor. In view of the above, it becomes possible to improve luminance and color rendering properties of the white light which is obtained by mixing in color of the individual light emitting components of blue, yellow and red by reinforcing the red light emitting component by the Eu and Mn-activated alkaline earth magnesium silicate phosphor. In other words, insufficient light emission of the red phosphor is reinforced by the Eu and Mn-activated alkaline earth magnesium silicate phosphor to improve the luminance balance, and the luminance of the white light can be enhanced. In addition, the color rendering properties of the white light can be improved by improving the luminance balance.

It is considered that the yellow phosphor having the composition represented by the formula (1) reinforces the red light emitting component by addition of light emission of Mn to the emission spectrum of the Eu-activated alkaline earth silicate phosphor. To obtain the above effect, the content of Mn is determined to be in a range of 0.0005 to 0.02 as the value of u in the formula (1). When the value of u is less than 0.0005, the reinforcing effect of the red light emitting component cannot be obtained sufficiently. When the value of u exceeds 0.02, an yellow light emitting component in a range of 535 to 570 nm reduces considerably more than the increasing effect of the red light emitting component in a range of 600 to 700 nm. The value of u is more preferably in a range of 0.005 to 0.02.

Eu is an activator for obtaining mainly yellow light emission. The content of Eu is determined to be in a range of 0.025 to 0.25 as the value of z in the formula (1) in order to obtain the yellow light emission. When the content of Eu deviates from the above range, strength and the like of the yellow light emitting component become low. The content of Eu is more preferably in a range of 0.05 to 0.2 as the value of z.

The reinforcing effect of the red light emitting component by the Eu and Mn-activated alkaline earth magnesium silicate phosphor is a phenomenon which occurs prominently when excited by ultraviolet light or violet light having a peak wavelength in a range of 370 to 430 nm. A red component of the emission spectrum is somewhat enhanced even when the Eu and Mn-activated alkaline earth magnesium silicate phosphor is excited by blue light (the light emitted from the blue LED) having a peak wavelength of 440 to 470 nm. The Eu and Mn-activated alkaline earth magnesium silicate phosphor is effective as a yellow phosphor of the white LED lamp 1 using as an excitation source the LED chip 2 having a peak wavelength in a range of 370 to 430 nm.

Incidentally, when Mn is merely added to a conventional Eu-activated alkaline earth silicate phosphor ((Sr, Ba, Eu)$_2$SiO$_4$ phosphor), the phosphor body color turns into black at the time of producing the phosphor, and a good light-emitting property cannot be obtained. Therefore, the yellow phosphor of this embodiment further has Mg added to the Eu and Mn-activated alkaline earth silicate phosphor ((Sr, Ba, Eu, Mn)$_2$SiO$_4$ phosphor).

The addition of Mg to the (Sr, Ba, Eu, Mn)$_2$SiO$_4$ phosphor enables to keep the light-emitting property of the yellow phosphor. To obtain the above-described blackening preventing effect, the Mg content is set to a range of 0.025 to 0.105 as the value of y in the formula (1). If the value of y is less than 0.025, the blackening preventing effect of the yellow phosphor cannot be obtained sufficiently. If the value of y exceeds 0.105, the yellow light emitting component in a range of 535 to 570 nm reduces. The value of y is more preferably in a range of 0.075 to 0.105.

The content of Ba is set to a range of 0.1 to 0.35 as the value of x in the formula (1) in order to have the Eu and Mn-activated alkaline earth magnesium silicate phosphor as the yellow phosphor. If the content of Ba deviates from the above range, the crystal structure or the like of alkaline earth silicate changes to form a phosphor having a greenish color. The value of x is more preferably determined to be in a range of 0.1 to 0.3.

For the blue phosphor and the red phosphor among the individual phosphors configuring the BYR phosphor 8, various phosphors which efficiently absorb the light (especially, ultraviolet light or violet light) emitted from the LED chip 2 can be used. In view of the combination with the yellow phosphor comprising the Eu and Mn-activated alkaline earth magnesium silicate phosphor, the blue phosphor is preferably at least one selected from the Eu-activated alkaline earth chlorophosphate phosphor and the Eu-activated aluminate phosphor. The red phosphor is preferably an Eu-activated lanthanum oxysulfide phosphor.

The Eu-activated alkaline earth chlorophosphate phosphor as the blue phosphor preferably has a composition represented by a general formula:

$$(Sr_{1-a-b-c}, Ba_a, Ca_b, Eu_c)_5(PO_4)_3Cl \quad (2)$$

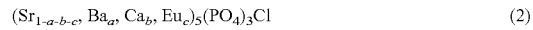

(where, a, b and c are numerals satisfying $0 \leq a \leq 0.45$, $0 \leq b \leq 0.03$, $0.005 \leq c \leq 0.03$). The Eu-activated alkaline earth chlorophosphate phosphor satisfying the composition of the formula (2) has high absorption efficiency for the light emitted from the LED chip 2 and excels in property of combination with the yellow phosphor represented by the formula (1).

The Eu-activated aluminate phosphor preferably has a composition represented by a general formula:

$$(Ba_{1-a-b-c}, Sr_a, Ca_b, Eu_c)MgAl_{10}O_{17} \quad (3)$$

(where, a, b and c are numerals satisfying $0 \leq a \leq 0.1$, $0 \leq b \leq 0.1$, $0.005 \leq c \leq 0.4$). The Eu-activated aluminate phosphor satisfying the composition of the formula (3) has high absorption efficiency for the light emitted from the LED chip 2 and excels in property of combination with the yellow phosphor represented by the formula (1).

The Eu-activated lanthanum oxysulfide phosphor as the red phosphor preferably has a composition represented by a general formula:

$$(La_{1-a-b}, Eu_a, M_b)_2O_2S \quad (4)$$

(where, M indicates at least one selected from Sm, Ga, Sb and Sn, and a and b are numerals satisfying $0.08 \leq a \leq 0.16$, $0.000001 \leq b \leq 0.003$). The Eu-activated lanthanum oxysulfide phosphor satisfying the composition of the formula (4) has high absorption efficiency for the light emitted from the LED chip 2 and excels in property of combination with the yellow phosphor represented by the formula (1).

Figure 4:
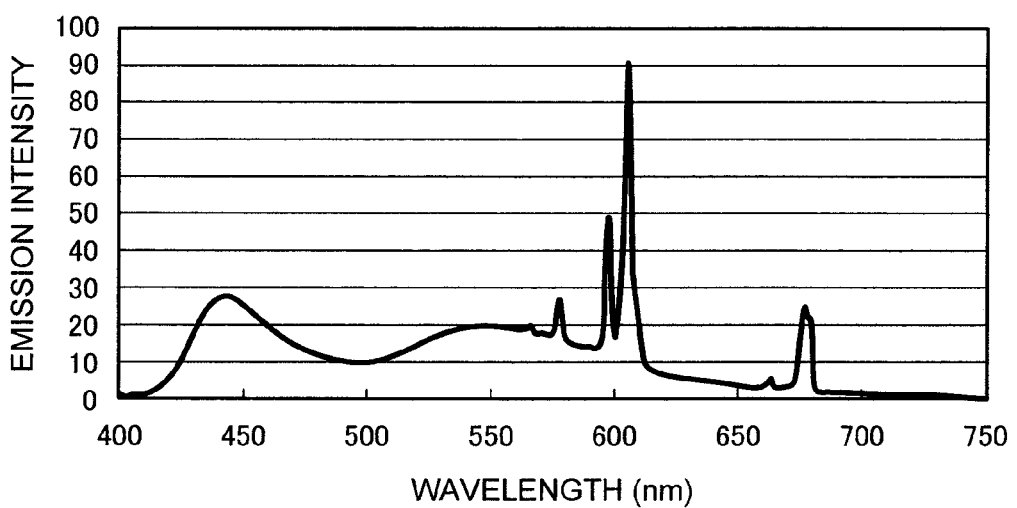
FIG. 4 is a diagram showing an example of emission spectrum of the white LED lamp according to an embodiment of the invention.

FIG. 4 shows an example of emission spectrum of the white LED lamp 1 using the above-described BYR phosphor 8 containing the individual phosphors of blue, yellow and red. FIG. 4 shows the emission spectrum when the ultraviolet light from the LED chip having a current value of 20 mA and a peak value of 400 nm is converted by the BYR phosphor into white light having a (x, y) chromaticity value (x=0.300 to 0.350, y=0.300 to 0.350). According to the combination of the above-described individual phosphors, the blue light emitting component has a peak value of 450 nm, the green light emitting component has a peak value of 560 nm, and the red light emitting component has a peak value of 623 nm, and characteristic values including luminance of 370 mcd or more and an average color rendering index (Ra) of 90 or more can be obtained.

The individual phosphors of blue, yellow and red are dispersed, for example, as their mixture into the transparent resin layer 7. The mixing ratio of each phosphor is set arbitrarily according to the chromaticity of the target white light. If necessary, phosphors other than blue, yellow and red may be added. To obtain good quality white light emission by the light-emitting portion 9, the mixing ratios of the individual phosphors are preferably determined such that the blue phosphor is in a range of 15 to 35 mass %, the yellow phosphor is in a range of 35 to 70 mass %, and the red phosphor is the balance (the total of the blue phosphor, the yellow phosphor and the red phosphor is 100 mass %).

In addition, the individual phosphors of blue, yellow and red preferably have an average particle diameter in a range of 10 μm to 80 μm. The average particle diameter here indicates an intermediate value (50% value) of grain size distribution. The absorption efficiency of the ultraviolet light or violet light emitted from the LED chip 2 can be enhanced by determining the average particle diameter of the individual phosphors of blue, yellow and red to fall in a range of 10 to 80 μm. Thus, it becomes possible to enhance further the luminance of the white LED lamp 1. It is more preferable that the average particle diameter of the phosphors is determined to fall in a range of 20 to 70 μm.

To enhance the uniformity of the dispersed state of the individual phosphors of blue, yellow and red in the transparent resin layer 7, they may be previously integrated by a binding agent such as an inorganic binder or an organic binder and dispersed in the integrated state into the transparent resin layer 7. As the inorganic binder, finely-divided alkaline earth borate or the like is used. As the organic binder, a transparent resin such as an acrylic resin or a silicone resin is used. The individual phosphors are undergone integration processing using a binding agent and aggregated at random to have a large particle diameter. Thus, the nonuniformity of the dispersed state due to a difference in sedimentation velocity of the individual phosphors in the transparent resin layer 7 is remedied, and it becomes possible to enhance the reproducibility of white light and the uniformity of light emission.

Figure 5:
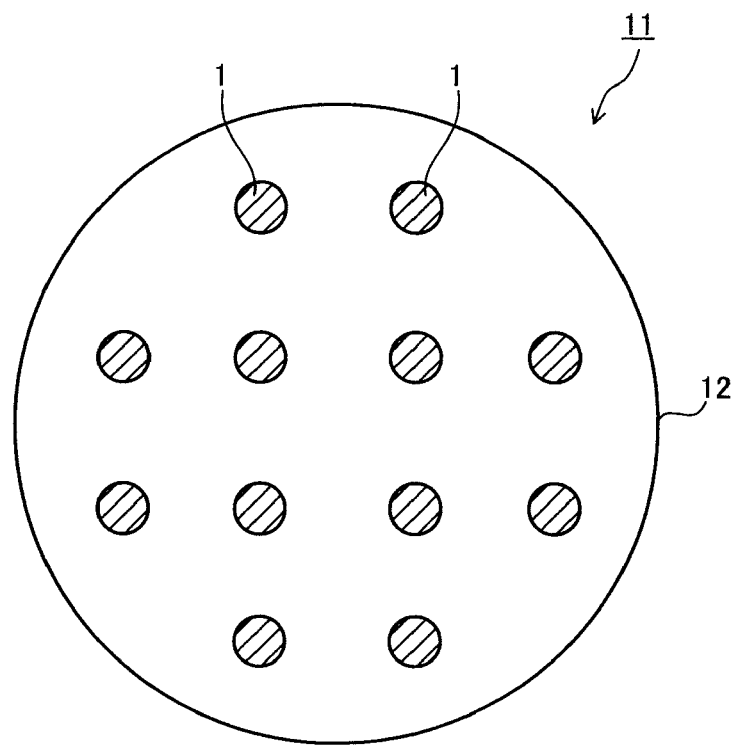
FIG. 5 is a plan view showing a structure of the illuminating device according to an embodiment of the invention.
Figure 6:
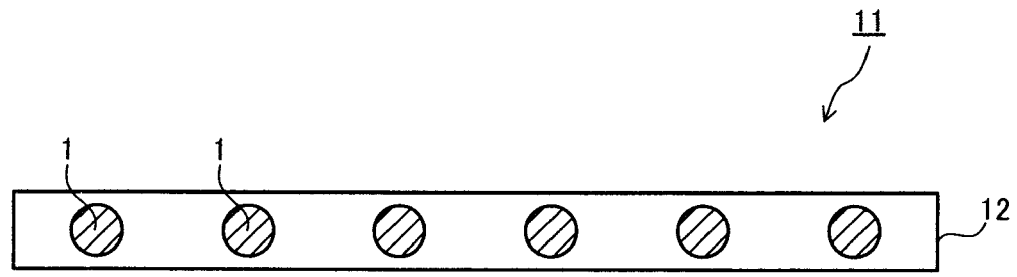
FIG. 6 is a plan view showing a modified example of the illuminating device shown in FIG. 5.

The white LED lamp 1 of this embodiment excels in lamp characteristics such as luminance characteristics, color rendering properties, color reproducibility and the like. Therefore, the white LED lamp 1 is effective as a light source of an illuminating device of vehicle-mounted lamps, signal equipment, various types of switches, general lighting and the like. The illuminating device according to the embodiment of the invention is provided with one or plural white LED lamps 1 as a light source. FIG. 5 and FIG. 6 show illuminating devices (lighting fixtures) according to embodiments of the invention. Illuminating devices 11 shown in the drawings are provided with plural white LED lamps 1 as light sources.

The white LED lamps 1 are used in a state arranged in various forms on a substrate 12 depending on an amount of light, usage and the like of the applied illuminating device 11. FIG. 5 shows the illuminating device 11 which is provided with plural white LED lamps 1 arranged in a matrix form on a disk-like substrate 12. FIG. 6 shows the illuminating device 11 which is provided with the plural white LED lamps 1 arranged linearly on a rectangular substrate 12. The substrate 12 may be the wiring board 3 for the white LED lamps 1 or a board independent of the wiring board 3. The illuminating device 11 using the white LED lamps 1 of this embodiment provides high-quality lighting as a replacement for the conventional fluorescent lamp.

Then, specific examples of the present invention and their evaluation results are described below.

Example 1

An Eu-activated alkaline earth chlorophosphate (($Sr_{0.59}$, $Ca_{0.01}$, $Ba_{0.39}$, $Eu_{0.01}$)$_5$($PO_4$)$_3$·Cl) phosphor having an average particle diameter of 12 μm was prepared as a blue phosphor. An Eu and Mn-activated alkaline earth magnesium silicate (($Sr_{0.7}$, $Ba_{0.15}$, $Mg_{0.0975}$, $Eu_{0.05}$, $Mn_{0.0025}$)$_2$$SiO_4$) phosphor having an average particle diameter of 15 μm was prepared as a yellow phosphor. An Eu-activated lanthanum oxysulfide (($La_{0.938}$, $Eu_{0.06}$, $Sm_{0.002}$)$_2$$O_2$S) phosphor having an average particle diameter of 12 μm was prepared as a red phosphor. The particle diameters of the phosphors are values measured by a laser diffraction method.

Each phosphor was mixed at a ratio of 30 mass % with a silicone resin to produce a slurry. The obtained blue phosphor slurry, yellow phosphor slurry and red phosphor slurry each were mixed at a ratio of 30 mass %, 43 mass % and 27 mass % so that emission chromaticity of the white LED lamp fell in a range of (x=0.29 to 0.34, y=0.29 to 0.34).

A silicone resin not containing a phosphor was dripped onto an LED chip (emission peak wavelength: 399 nm, size: 300×300 μm) 2 of the white LED lamp 1 of which structure is shown in FIG. 2, a mixture slurry containing the above-described individual phosphors was further dripped, and the silicone resin was cured by a heat treatment at 140 degrees C. to produce the white LED lamp 1. The obtained white LED lamp was subjected to the characteristic evaluation described later.

Example 2

An Eu-activated alkaline earth chlorophosphate (($Sr_{0.75}$, $Ca_{0.01}$, $Ba_{0.23}$, $Eu_{0.01}$)$_5$($PO_4$)$_3$·Cl) phosphor having an average particle diameter of 15 μm was prepared as a blue phosphor. An Eu and Mn-activated alkaline earth magnesium silicate (($Sr_{0.7}$, $Ba_{0.15}$, $Mg_{0.0965}$, $Eu_{0.05}$, $Mn_{0.0035}$)$_2$$SiO_4$) phosphor having an average particle diameter of 16 μm was prepared as a yellow phosphor. An Eu-activated lanthanum oxysulfide (($La_{0.938}$, $Eu_{0.06}$, $Ga_{0.002}$)$_2$$O_2$S) phosphor having an average particle diameter of 17 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 22 mass %, 67 mass % and 11 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 1 except that the prepared mixture slurry was used, and it was subjected to the characteristic evaluation described later.

Example 3

An Eu-activated alkaline earth chlorophosphate (($Sr_{0.59}$, $Ca_{0.01}$, $Ba_{0.39}$, $Eu_{0.01}$)$_5$($PO_4$)$_3$·Cl) phosphor having an average particle diameter of 23 μm was prepared as a blue phosphor. An Eu and Mn-activated alkaline earth magnesium silicate (($Sr_{0.7}$, $Ba_{0.15}$, $Mg_{0.095}$, $Eu_{0.05}$, $Mn_{0.005}$)$_2$$SiO_4$) phosphor having an average particle diameter of 25 μm was prepared as a yellow phosphor. An Eu-activated lanthanum oxysulfide (($La_{0.9397}$, $Eu_{0.06}$, $Sb_{0.0003}$)$_2$$O_2$S) phosphor having an average particle diameter of 25 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 29 mass %, 41 mass % and 30 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 1 except that the prepared mixture slurry was used, and it was subjected to the characteristic evaluation described later.

Example 4

An Eu-activated aluminate ($(Ba_{0.72}, Eu_{0.28})MgAl_{10}O_{17}$) phosphor having an average particle diameter of 17 μm was prepared as a blue phosphor. An Eu and Mn-activated alkaline earth magnesium silicate (($Sr_{0.7}$, $Ba_{0.15}$, $Mg_{0.0975}$, $Eu_{0.05}$, $Mn_{0.0025})_2SiO_4$) phosphor having an average particle diameter of 18 μm was prepared as a yellow phosphor. An Eu-activated lanthanum oxysulfide (($La_{0.9397}$, $Eu_{0.06}$, $Sm_{0.0003})_2O_2S$) phosphor having an average particle diameter of 15 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 25 mass %, 55 mass % and 20 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 1 except that the prepared mixture slurry was used, and it was subjected to the characteristic evaluation described later.

Example 5

An Eu-activated alkaline earth chlorophosphate (($Sr_{0.75}$, $Ca_{0.01}$, $Ba_{0.23}$, $Eu_{0.01})_5(PO_4)_3Cl$) phosphor having an average particle diameter of 25 μm was prepared as a blue phosphor. An Eu and Mn-activated alkaline earth magnesium silicate (($Sr_{0.7}$, $Ba_{0.15}$, $Mg_{0.0975}$, $Eu_{0.05}$, $Mn_{0.0025})_2SiO_4$) phosphor having an average particle diameter of 27 μm was prepared as a yellow phosphor. An Eu-activated lanthanum oxysulfide (($La_{0.9399}$, $Eu_{0.06}$, $Sn_{0.0001})_2O_2S$) phosphor having an average particle diameter of 25 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 25 mass %, 65 mass % and 10 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 1 except that the prepared mixture slurry was used, and it was subjected to the characteristic evaluation described later.

Comparative Example 1

An Eu-activated alkaline earth chlorophosphate (($Sr_{0.75}$, $Ca_{0.01}$, $Ba_{0.23}$, $Eu_{0.01})_5(PO_4)_3.Cl$) phosphor having an average particle diameter of 5 μm was prepared as a blue phosphor. An Eu and Mn-activated aluminate (($Ba_{0.8}$, $Eu_{0.2}$)($Mg_{0.75}$, $Mn_{0.25})Al_{10}O_{17}$) phosphor having an average particle diameter of 7 μm was prepared as a yellow phosphor. An Eu-activated lanthanum oxysulfide (($La_{0.94}$, $Eu_{0.06})_2O_2S$) phosphor having an average particle diameter of 7 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 15 mass %, 14 mass % and 71 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 1 except that the prepared mixture slurry was used, and it was subjected to the characteristic evaluation described later.

Comparative Example 2

An Eu-activated alkaline earth chlorophosphate (($Sr_{0.59}$, $Ca_{0.01}$, $Ba_{0.39}$, $Eu_{0.01})_5(PO_4)_3.Cl$) phosphor having an average particle diameter of 12 μm was prepared as a blue phosphor. An Eu-activated alkaline earth silicate (($Sr_{0.78}$, $Ba_{0.11}$, $Ca_{0.01}$, $Eu_{0.1})_2SiO_4$) phosphor having an average particle diameter of 15 μm was prepared as a yellow phosphor. An Eu-activated lanthanum oxysulfide (($La_{0.938}$, $Eu_{0.06}$, $Sm_{0.002})_2O_2S$) phosphor having an average particle diameter of 12 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 56 mass, 12 mass % and 32 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 1 except that the prepared mixture slurry was used, and it was subjected to the characteristic evaluation described later.

Example 6

An Eu-activated alkaline earth chlorophosphate (($Sr_{0.59}$, $Ca_{0.01}$, $Ba_{0.39}$, $Eu_{0.01})_5(PO_4)_3.Cl$) phosphor having an average particle diameter of 35 μm was prepared as a blue phosphor. An Eu and Mn-activated alkaline earth magnesium silicate (($Sr_{0.7}$, $Ba_{0.15}$, $Mg_{0.0975}$, $Eu_{0.05}$, $Mn_{0.0025})_2SiO_4$) phosphor having an average particle diameter of 32 μm was prepared as a yellow phosphor. An Eu-activated lanthanum oxysulfide (($La_{0.9398}$, $Eu_{0.06}$, $Sm_{0.0002})_2O_2S$) phosphor having an average particle diameter of 38 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 31 mass %, 44 mass % and 25 mass % so that emission chromaticity of the white LED lamp fell in a range of (x=0.29 to 0.34, y=0.29 to 0.34).

A silicone resin not containing a phosphor was dripped onto an LED chip (emission peak wavelength: 396 nm, size: 300×300 μm) 2 of the white LED lamp 1 of which structure is shown in FIG. 2, a mixture slurry containing the above-described individual phosphors was further dripped, and the silicone resin was cured by a heat treatment at 140 degrees C. to produce the white LED lamp 1. The obtained white LED lamp was subjected to the characteristic evaluation described later.

Example 7

An Eu-activated alkaline earth chlorophosphate (($Sr_{0.75}$, $Ca_{0.01}$, $Ba_{0.23}$, $Eu_{0.01})_5(PO_4)_3.Cl$) phosphor having an average particle diameter of 34 μm was prepared as a blue phosphor. An Eu and Mn-activated alkaline earth magnesium silicate $((Sr_{0.7}, Ba_{0.15}, Mg_{0.0975}, Eu_{0.05}, Mn_{0.0025})_2SiO_4)$ phosphor having an average particle diameter of 35 μm was prepared as a yellow phosphor. An Eu-activated lanthanum oxysulfide $((La_{0.939}, Eu_{0.06}, Ga_{0.001})_2O_2S)$ phosphor having an average particle diameter of 33 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 24 mass %, 65 mass % and 11 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 6 except that the prepared mixture slurry was used, and it was subjected to the characteristic evaluation described later.

Example 8

An Eu-activated aluminate $((Ba_{0.72}, Sr_{0.02}, Ca_{0.01}, Eu_{0.25})MgAl_{10}O_{17})$ phosphor having an average particle diameter of 30 μm was prepared as a blue phosphor. An Eu and Mn-activated alkaline earth magnesium silicate $((Sr_{0.7}, Ba_{0.15}, Mg_{0.0975}, Eu_{0.05}, Mn_{0.0025})_2SiO_4)$ phosphor having an average particle diameter of 29 μm was prepared as a yellow phosphor. An Eu-activated lanthanum oxysulfide $((La_{0.938}, Eu_{0.06}, Sm_{0.002})_2O_2S)$ phosphor having an average particle diameter of 31 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 23 mass %, 57 mass % and 20 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 6 except that the prepared mixture slurry was used, and it was subjected to the characteristic evaluation described later.

Example 9

An Eu-activated alkaline earth chlorophosphate $((Sr_{0.75}, Ca_{0.01}, Ba_{0.23}, Eu_{0.01})_5(PO_4)_3.Cl)$ phosphor having an average particle diameter of 45 μm was prepared as a blue phosphor. An Eu and Mn-activated alkaline earth magnesium silicate $((Sr_{0.7}, Ba_{0.15}, Mg_{0.0975}, Eu_{0.05}, Mn_{0.0025})_2SiO_4)$ phosphor having an average particle diameter of 48 μm was prepared as a yellow phosphor. An Eu-activated lanthanum oxysulfide $((La_{0.9397}, Eu_{0.06}, Sm_{0.0003})_2O_2S)$ phosphor having an average particle diameter of 49 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 20 mass %, 65 mass % and 15 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 1 except that the prepared mixture slurry was used, and it was subjected to the characteristic evaluation described later.

Example 10

An Eu-activated aluminate $((Ba_{0.8}, Eu_{0.2})MgAl_{10}O_{17})$ phosphor having an average particle diameter of 55 μm was prepared as a blue phosphor. An Eu and Mn-activated alkaline earth magnesium silicate $((Sr_{0.7}, Ba_{0.15}, Mg_{0.0975}, Eu_{0.05}, Mn_{0.0025})_2SiO_4)$ phosphor having an average particle diameter of 60 μm was prepared as a yellow phosphor. An Eu-activated lanthanum oxysulfide $((La_{0.938}, Eu_{0.06}, Sb_{0.002})_2O_2S)$ phosphor having an average particle diameter of 57 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 22 masse, 53 mass % and 25 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 1 except that the prepared mixture slurry was used, and it was subjected to the characteristic evaluation described later.

Comparative Example 3

An Eu-activated alkaline earth chlorophosphate $((Sr_{0.75}, Ca_{0.01}, Ba_{0.23}, Eu_{0.01})_5(PO_4)_3.Cl)$ phosphor having an average particle diameter of 5 μm was prepared as a blue phosphor. An Eu and Mn-activated aluminate $((Ba_{0.8}, Eu_{0.2})(Mg_{0.75}, Mn_{0.25})Al_{10}O_{17})$ phosphor having an average particle diameter of 3 μm was prepared as a yellow phosphor. An Eu-activated lanthanum oxysulfide $((La_{0.94}, Eu_{0.06})_2O_2S)$ phosphor having an average particle diameter of 8 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 15 mass %, 14 mass % and 71 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 6 except that the prepared mixture slurry was used, and it was subjected to the characteristic evaluation described later.

Comparative Example 4

An Eu-activated alkaline earth chlorophosphate $((Sr_{0.59}, Ca_{0.01}, Ba_{0.39}, Eu_{0.01})_5(PO_4)_3.Cl)$ phosphor having an average particle diameter of 35 μm was prepared as a blue phosphor. An Eu-activated alkaline earth silicate $((Sr_{0.78}, Ba_{0.115}, Ca_{0.005}, Eu_{0.1})_2SiO_4)$ phosphor having an average particle diameter of 32 μm was prepared as a yellow phosphor. An Eu-activated lanthanum oxysulfide $((La_{0.9398}, Eu_{0.06}, Sm_{0.0002})_2O_2S)$ phosphor having an average particle diameter of 38 μm was prepared as a red phosphor.

Each phosphor was mixed at a ratio of 30 mass % with a silicone resin to produce a slurry. The obtained blue phosphor slurry, yellow phosphor slurry and red phosphor slurry each were mixed at a ratio of 54 mass %, 9 mass % and 37 mass % so that emission chromaticity of the white LED lamp fell in a range of (x=0.29 to 0.34, y=0.29 to 0.34). The white LED lamp 1 of which structure is shown in FIG. 2 was produced in the same manner as in Example 6 except that the prepared mixture slurry was used, and it was subjected to the characteristic evaluation described later.

The individual white LED lamps of Examples 1 to 10 and Comparative Examples 1 to 4 were lit by passing an electric current of 20 mA. The individual white LED lamps were measured for luminance and an average color rendering index. The measurement results are shown in Table 1. The individual white LED lamps were measured for the light-emitting property by a CAS 140 COMPACT ARRAY SPECTROMETER produced by Instrument Systems and an MCPD produced by Otsuka Electronics Co., Ltd.

TABLE 1

|  | Luminance (mcd) | Average color rendering index Ra |
|---|---|---|
| Example 1 | 300 | 94 |
| Example 2 | 350 | 90 |
| Example 3 | 340 | 95 |
| Example 4 | 320 | 92 |
| Example 5 | 380 | 91 |
| Comparative Example 1 | 180 | 81 |
| Comparative Example 2 | 250 | 85 |
| Example 6 | 370 | 94 |
| Example 7 | 400 | 90 |
| Example 8 | 350 | 92 |
| Example 9 | 430 | 90 |
| Example 10 | 360 | 92 |
| Comparative Example 3 | 250 | 70 |
| Comparative Example 4 | 290 | 82 |

It is apparent from Table 1 that the individual white LED lamps of Examples 1 to 10 are excellent in luminance and color rendering properties in comparison with those of Comparative Examples 1 to 4. In addition, it was confirmed by producing the illuminating devices shown in FIG. 3 using the white LED lamps according to Examples 1 to 10 that the individual white LED lamps of Examples 1 to 10 exhibited good light-emitting property.

INDUSTRIAL APPLICABILITY

The white light-emitting lamp of the invention uses a europium and manganese-activated alkaline earth magnesium silicate phosphor containing more long-wavelength components as a yellow phosphor. Therefore, both luminance characteristics and color rendering properties can be improved. The white light-emitting lamp achieving both high color rendering properties and high luminance can be used effectively for lighting and others.

What is claimed is:

1. A white light-emitting lamp, comprising:
   a semiconductor light-emitting element which emits light having a peak wavelength in a range of 370 nm to 470 nm; and
   a light-emitting portion, which is excited by the light emitted from the semiconductor light-emitting element to emit white light, containing a blue phosphor which absorbs the light to emit light having a peak wavelength in a range of 440 nm to 470 nm, a yellow phosphor which absorbs the light to emit light having a peak wavelength in a range of 535 nm to 570 nm and a red phosphor which absorbs the light to emit light having a peak wavelength in a range of 590 nm to 630 nm,
   wherein the yellow phosphor is composed of a europium and manganese-activated alkaline earth magnesium silicate phosphor having a composition expressed by a general formula:

$$(Sr_{1-x-y-z-u}, Ba_x, Mg_y, Eu_z, Mn_u)_2SiO_4$$

where, x, y, z and u are numerals satisfying $0.1 \leq x \leq 0.35$, $0.025 \leq y \leq 0.105$, $0.025 \leq z \leq 0.25$, $0.0005 \leq u \leq 0.02$.

2. The white light-emitting lamp according to claim 1,
   wherein the blue phosphor is composed of at least one selected from:
   a europium-activated alkaline earth chlorophosphate phosphor having a composition expressed by a general formula:

$$(Sr_{1-a-b-c}, Ba_a, Ca_b, Eu_c)_5(PO_4)_3Cl$$

where, a, b and c are numerals satisfying $0 \leq a \leq 0.45$, $0 \leq b \leq 0.03$, $0.005 \leq c \leq 0.03$; and
a europium-activated aluminate phosphor having a composition expressed by a general formula:

$$(Ba_{1-a-b-c}, Sr_a, Ca_b, Eu_c)MgAl_{10}O_{17}$$

where, a, b and c are numerals satisfying $0 \leq a \leq 0.1$, $0 \leq b \leq 0.1$, $0.005 \leq c \leq 0.4$.

3. The white light-emitting lamp according to claim 1,
   wherein the red phosphor is composed of a europium-activated lanthanum oxysulfide phosphor having a composition expressed by a general formula:

$$(La_{1-a-b}, Eu_a, M_b)_2O_2S$$

where, M represents at least one selected from Sm, Ga, Sb and Sn, and a and b are numerals satisfying $0.08 \leq a \leq 0.16$, $0.000001 \leq b \leq 0.003$.

4. The white light-emitting lamp according to claim 1,
   wherein the blue phosphor, the yellow phosphor and the red phosphor have an average particle diameter in a range of 10 μm to 80 μm.

5. The white light-emitting lamp according to claim 1,
   wherein the light-emitting portion includes a transparent resin layer which is formed to cover a light-emitting surface of the semiconductor light-emitting element and contains the blue phosphor, the yellow phosphor and the red phosphor.

6. The white light-emitting lamp according to claim 1,
   wherein the light-emitting portion includes a first transparent resin layer which is formed to cover a light-emitting surface of the semiconductor light-emitting element and does not contain the blue phosphor, the yellow phosphor and the red phosphor, and a second transparent resin layer which is formed to cover the first transparent resin layer and contains the blue phosphor, the yellow phosphor and the red phosphor.

7. The white light-emitting lamp according to claim 1,
   wherein the semiconductor light-emitting element has the peak wavelength in a range of 370 nm to 430 nm.

8. The white light-emitting lamp according to claim 1,
   wherein the semiconductor light-emitting element is provided with a light-emitting diode or a laser diode.

9. An illuminating device, comprising,
   the white light-emitting lamp according to claim 1.

10. The illuminating device according to claim 9, further comprising,
    a substrate on which a plurality of the white light-emitting lamps are arranged.

11. The illuminating device according to claim 9,
    wherein the blue phosphor is composed of at least one selected from:
    a europium-activated alkaline earth chlorophosphate phosphor having a composition expressed by a general formula:

$$(Sr_{1-a-b-c}, Ba_a, Ca_b, Eu_c)_5(PO_4)_3Cl$$

where, a, b and c are numerals satisfying $0 \leq a \leq 0.45$, $0 \leq b \leq 0.03$, $0.005 \leq c \leq 0.03$; and
a europium-activated aluminate phosphor having a composition expressed by a general formula:

$$(Ba_{1-a-b-c}, Sr_a, Ca_b, Eu_c)MgAl_{10}O_{17}$$

where, a, b and c are numerals satisfying $0 \leq a \leq 0.1$, $0 \leq b \leq 0.1$, $0.005 \leq c \leq 0.4$.

12. The illuminating device according to claim 9,
    wherein the red phosphor is composed of a europium-activated lanthanum oxysulfide phosphor having a composition expressed by a general formula:

$$(La_{1-a-b}, Eu_a, M_b)_2O_2S$$

where, M represents at least one selected from Sm, Ga, Sb and Sn, and a and b are numerals satisfying $0.08 \leq a \leq 0.16$, $0.000001 \leq b \leq 0.003$.

13. The illuminating device according to claim 9,
wherein the light-emitting portion includes a first transparent resin layer which is formed to cover a light-emitting surface of the semiconductor light-emitting element and does not contain the blue phosphor, the yellow phosphor and the red phosphor, and a second transparent resin layer which is formed to cover the first transparent resin layer and contains the blue phosphor, the yellow phosphor and the red phosphor.

14. The illuminating device according to claim 9,
wherein the semiconductor light-emitting element has the peak wavelength in a range of 370 nm to 430 nm.

* * * * *